United States Patent
Wang et al.

(10) Patent No.: US 9,484,877 B2
(45) Date of Patent: Nov. 1, 2016

(54) RESONATING DEVICE WITH SINGLE OPERATIONAL AMPLIFIER

(71) Applicant: MEDIATEK INC., Hsin-Chu (TW)

(72) Inventors: Chi-Yun Wang, Tainan (TW); Chih-Hong Lou, Yilan County (TW); Yen-Chuan Huang, Hsinchu County (TW); Li-Han Hung, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 65 days.

(21) Appl. No.: 14/467,066

(22) Filed: Aug. 25, 2014

(65) Prior Publication Data
US 2016/0056783 A1 Feb. 25, 2016

(51) Int. Cl.
| | | |
|---|---|---|
| H03F 1/34 | (2006.01) | |
| H03G 3/30 | (2006.01) | |
| H03F 1/56 | (2006.01) | |
| H03F 3/45 | (2006.01) | |
| H03B 5/24 | (2006.01) | |

(52) U.S. Cl.
CPC .................. *H03G 3/30* (2013.01); *H03B 5/24* (2013.01); *H03F 1/56* (2013.01); *H03F 3/45475* (2013.01); *H03F 2203/45116* (2013.01); *H03F 2203/45118* (2013.01); *H03F 2203/45526* (2013.01)

(58) Field of Classification Search
CPC .................................. H03F 1/34; H03G 3/20
USPC ............................................. 330/86, 254, 260
See application file for complete search history.

(56) References Cited

U.S. PATENT DOCUMENTS

| | | | |
|---|---|---|---|
| 3,729,666 A * | 4/1973 | Kelly | ............................ 318/458 |
| 4,301,446 A | 11/1981 | Petit | |
| 4,984,292 A | 1/1991 | Millen | |
| 5,392,042 A | 2/1995 | Pellon | |
| 5,500,645 A | 3/1996 | Ribner | |
| 5,673,044 A | 9/1997 | Pellon | |
| 5,917,440 A | 6/1999 | Khoury | |
| 6,157,329 A | 12/2000 | Lee | |
| 6,954,159 B1 | 10/2005 | Cooper | |

(Continued)

FOREIGN PATENT DOCUMENTS

EP          2 346 167 A1      7/2011

OTHER PUBLICATIONS

Kazuo Matsukawa, A Fifth-Order Continuous-Time Delta-Sigma Modulator With Single-Opamp Resonator, IEEE Journal of Solid-State Circuits, April 2010, 697-706,vol. 45, No. 4.

(Continued)

*Primary Examiner* — Henry Choe
(74) *Attorney, Agent, or Firm* — Winston Hsu; Scott Margo

(57) ABSTRACT

A resonating device includes: an amplifying circuit having a first input terminal, and an output terminal for outputting an output signal; a first feedback circuit coupled between the first input terminal and the output terminal of the amplifying circuit; a second feedback circuit, coupled between the first input terminal and the output terminal of the amplifying circuit; and a gain adjusting circuit, having an input terminal for receiving an input signal, and a first output terminal coupled to the first input terminal of the amplifying circuit; wherein a first equivalent impedance on a first intermediate terminal in the first feedback circuit substantially equals a second equivalent impedance on a second intermediate terminal in the second feedback circuit, and the gain adjusting circuit is arranged to tune a transfer function from the input signal to the output signal.

16 Claims, 7 Drawing Sheets

(56) References Cited

U.S. PATENT DOCUMENTS

| | | |
|---|---|---|
| 7,075,468 B1 | 7/2006 | Pellon |
| 7,242,336 B1 | 7/2007 | Jensen |
| 7,504,976 B1 | 3/2009 | Pellon |
| 8,013,771 B2 | 9/2011 | Booth |
| 8,044,718 B2 * | 10/2011 | Nicollini et al. ............... 330/86 |
| 8,497,791 B2 * | 7/2013 | Okumura et al. ............ 341/121 |
| 2010/0097258 A1 | 4/2010 | Koli |
| 2011/0148679 A1 | 6/2011 | Karthaus |
| 2012/0262320 A1 * | 10/2012 | Mitani ................... H03H 11/04 341/143 |
| 2013/0214951 A1 | 8/2013 | Ho |

OTHER PUBLICATIONS

Kazuo Matsukawa, A 5th-order Delta-Sigma Modulator with Single-Opamp Resonator, Symposium on VLSI Circuits Digest of Technical Papers, 2009, 68-69.

\* cited by examiner

US 9,484,877 B2

RESONATING DEVICE WITH SINGLE OPERATIONAL AMPLIFIER

BACKGROUND

The present invention relates to a single-operational amplifier resonating device, and more particularly to a low cost resonator with large tuning range.

In the field of data transmission system, an integrator or a resonator is an important circuit element. One purpose of the resonator is to realize a high quality-factor (Q) band-pass response for some circuit blocks in the system. Therefore, the resonator can be applied in a filter or a high resolution delta-sigma modulator. Conventionally, a resonator comprises two integrators connected in a way of negative feedback configuration, wherein one integrator comprises an operational amplifier. However, the conventional resonator is no longer suitable for the modern data transmission system because the two operational amplifiers in the resonator may occupy a large size area. Moreover, the modern data transmission system may require a wide tuning range resonator in order to operate under a wideband environment. Therefore, how to provide a low cost and wide tuning range resonator is an urgent problem in this field.

SUMMARY

Therefore, one objective of the present invention is to provide a low cost resonator with large tuning range.

According to an embodiment of the present invention, a resonating device is provided. The resonating device comprises an amplifying circuit, a first feedback circuit, a second feedback circuit, and a gain adjusting circuit. The amplifying circuit has a first input terminal and an output terminal for outputting an output signal. The first feedback circuit is coupled between the first input terminal and the output terminal of the amplifying circuit. The second feedback circuit is coupled between the first input terminal and the output terminal of the amplifying circuit. The gain adjusting circuit has an input terminal for receiving an input signal, and a first output terminal coupled to the first input terminal of the amplifying circuit; wherein a first equivalent impedance on a first intermediate terminal in the first feedback circuit substantially equals a second equivalent impedance on a second intermediate terminal in the second feedback circuit, and the gain adjusting circuit is arranged to tune a transfer function from the input signal to the output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
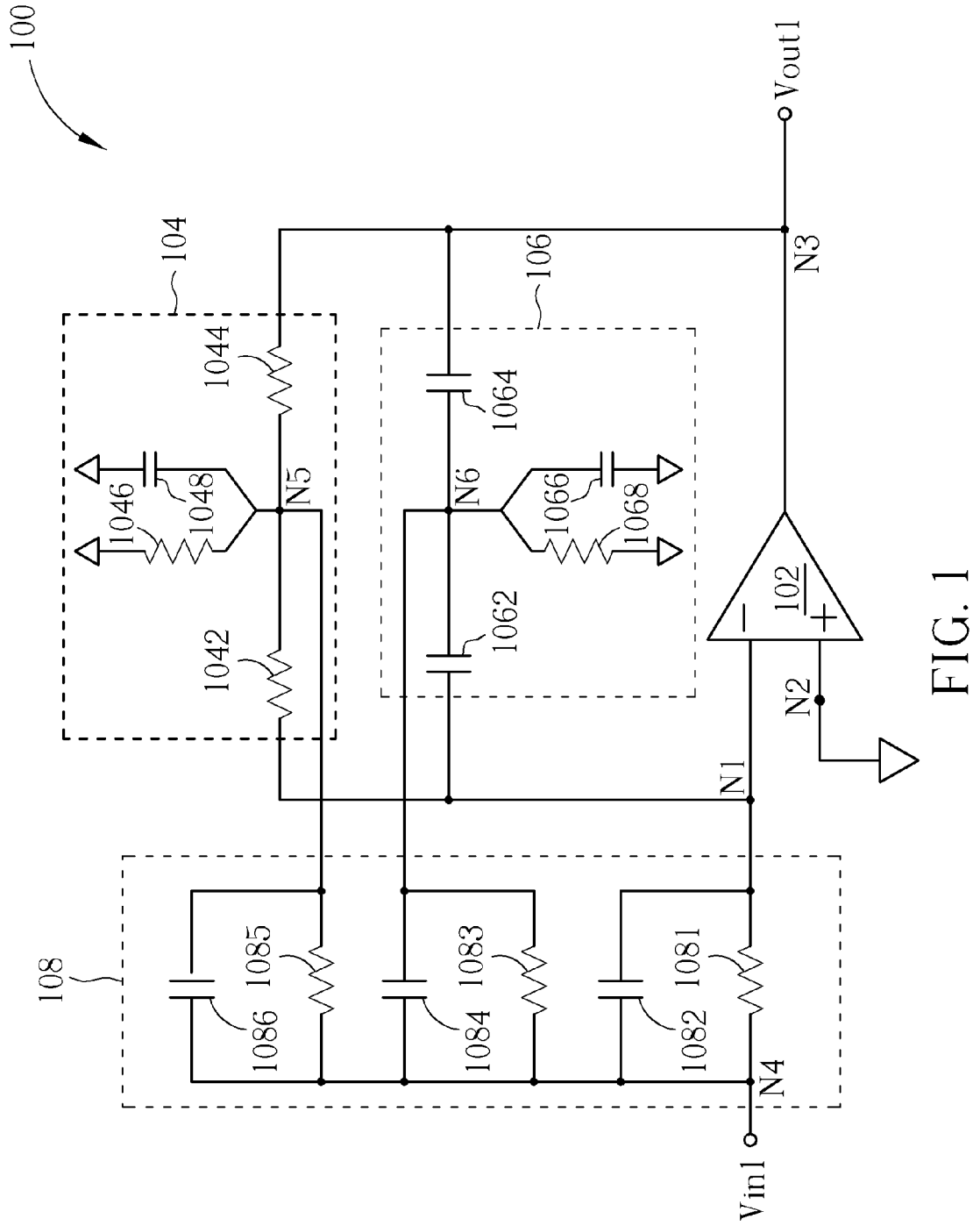
FIG. 1 is a diagram illustrating a resonating device according to a first embodiment of the present invention.

Please refer to FIG. 1, which is a diagram illustrating a resonating device 100 according to a first embodiment of the present invention. The resonating device 100 comprises an amplifying circuit 102, a first feedback circuit 104, a second feedback circuit 106, and a gain adjusting circuit 108. The amplifying circuit 102 is a differential operational amplifier. The amplifying circuit 102 has a first input terminal N1, a second input terminal N2, and an output terminal N3, wherein the first input terminal N1 is a negative input terminal (−) of the amplifying circuit 102, the second input terminal N2 is a positive input terminal (+) of the amplifying circuit 102 for coupling to a reference voltage Vgnd (e.g. the virtual ground voltage), and the output terminal N3 outputs an output signal Vout1. The first feedback circuit 104 is coupled between the first input terminal N1 and the output terminal N3 of the amplifying circuit 102. The second feedback circuit 106 is coupled between the first input terminal N1 and the output terminal N3 of the amplifying circuit 102. The gain adjusting circuit 108 has an input terminal N4 for receiving an input signal Vin1, and a first output terminal coupled to the first input terminal N1 of the amplifying circuit 102. In this embodiment, a first equivalent impedance on a first intermediate terminal N5 in the first feedback circuit 104 substantially equals a second equivalent impedance on a second intermediate terminal N6 in the second feedback circuit 106, and the gain adjusting circuit 108 is arranged to tune a transfer function from the input signal Vin1 to the output signal Vout1.

The first feedback circuit 104 comprises a first resistor 1042, a second resistor 1044, a third resistor 1046, and a capacitor 1048. The first resistor 1042 has a first terminal coupled to the first input terminal N1 of the amplifying circuit 102, and a second terminal coupled to the first intermediate terminal N5. The second resistor has a first terminal coupled to the first intermediate terminal N5, and a second terminal coupled to the output terminal N3 of the amplifying circuit 102. The third resistor 1046 has a first terminal coupled to the first intermediate terminal N5, and a second terminal coupled to the reference voltage Vgnd. The capacitor 1048 has a first terminal coupled to the first intermediate terminal N5, and a second terminal coupled to a reference voltage Vgnd.

The second feedback circuit 106 comprises a first capacitor 1062, a second capacitor 1064, a third capacitor 1066, and a resistor 1068. The first capacitor 1062 has a first terminal coupled to the first input terminal N1 of the amplifying circuit 102, and a second terminal coupled to the second intermediate terminal N6. The second capacitor 1064 has a first terminal coupled to the second intermediate terminal N6, and a second terminal coupled to the output terminal N3 of the amplifying circuit 102. The third capacitor 1066 has a first terminal coupled to the second intermediate terminal N6, and a second terminal coupled to the reference voltage Vgnd. The resistor 1068 has a first terminal coupled to the second intermediate terminal N6, and a second terminal coupled to a reference voltage Vgnd.

It is noted that the amplifying circuit 102 in combination with the first feedback circuit 104 and the second feedback circuit 106 is a so called twin-T network.

The gain adjusting circuit 108 comprises a first resistor 1081, a first capacitor 1082, a second resistor 1083, a second capacitor 1084, a third resistor 1085, and a third capacitor 1086. The first resistor 1081 has a first terminal for receiving the input signal Vin1, and a second terminal coupled to the first input terminal N1 of the amplifying circuit 102. The first capacitor 1082 has a first terminal for receiving the input signal Vin1, and a second terminal coupled to the first input terminal N1 of the amplifying circuit 102. The second resistor 1085 has a first terminal for receiving the input signal Vin1, and a second terminal coupled to the first intermediate terminal N5 of the first feedback circuit 104. The second capacitor 1086 has a first terminal for receiving the input signal Vin1, and a second terminal coupled to the first intermediate terminal N5 of the first feedback circuit 104. The third resistor 1083 has a first terminal for receiving the input signal Vin1, and a second terminal coupled to the second intermediate terminal N6 of the second feedback circuit 106. The third capacitor 1084 has a first terminal for receiving the input signal Vin1, and a second terminal coupled to the second intermediate terminal N6 of the second feedback circuit 106.

To make the resonating device 100 to act as a resonator, the first equivalent impedance on the first intermediate terminal N5 in the first feedback circuit 104 substantially equals the second equivalent impedance on the second intermediate terminal N6 in the second feedback circuit 106. In other words, both the first equivalent impedance and the second equivalent impedance are designed to have the same resistance $R_{P1}$ and the same capacitance $C_{P1}$ as illustrated by the following equations (1) and (2):

$$R_1 \| R_2 \| R_{IN1} \| R_A = R_3 \| R_{IN2} = R_{P1} \quad (1)$$

$$C_1 + C_2 + C_{IN2} + C_A + C_3 + C_{IN1} = C_{P1} \quad (2)$$

equations (1) and (2), $R_1$ represents the resistance of the first resistor 1042, $R_2$ represents the resistance of the second resistor 1044, $R_{IN1}$ represents the resistance of the second resistor 1085, $R_A$ represents the resistance of the third resistor 1046, $R_3$ represents the resistance of the resistor 1068, $R_{IN2}$ represents the resistance of the third resistor 1083, $C_1$ represents the capacitance of the first capacitor 1062, $C_2$ represents the capacitance of the second capacitor 1064, $C_{IN2}$ represents the capacitance of the third capacitor 1084, $C_A$ represents the capacitance of the third capacitor 1066, $C_3$ represents the capacitance of the capacitor 1048, and $C_{IN1}$ represents the capacitance of the second capacitor 1086.

Then, the transfer function, i.e. Vout1/Vin1, from the input signal Vin1 to the output signal Vout1 can be illustrated by the following equation (3):

$$\frac{Vout1}{Vin1} = \frac{\left(\frac{C_{P1}C_{IN}}{C_1C_2} + \frac{C_{IN2}}{C_2}\right)s^2 + \left(\frac{C_{IN1}}{C_1C_2R_1} + \frac{C_{IN}}{C_1C_2R_{P1}} + \frac{1}{R_{IN2}C_2} + \frac{C_{P1}}{C_1C_2R_{IN}}\right)s + \left(\frac{1}{R_1R_{IN1}C_1C_2} + \frac{1}{R_{P1}R_{IN}C_1C_2}\right)}{s^2 + \frac{1}{R_1R_2C_1C_2}} \quad (3)$$

$C_{IN}$ represents the capacitance of the first capacitor 1082, and $R_{IN}$ represents the resistance of the first resistor 1081. According to equation (3), the denominator of the transfer function Vout1/Vin1 is controlled by the first feedback circuit 104 and the second feedback circuit 106, and the numerator of the transfer function Vout1/Vin1 can be adjusted by the gain adjusting circuit 108 after the denominator is determined. In other words, the denominator is determined by the resistance $R_1$ of the first resistor 1042, the resistance $R_2$ of the second resistor 1044, the capacitance $C_1$ of the first capacitor 1062, and the capacitance $C_2$ of the second capacitor 1064. The numerator can be adjusted by the capacitance $C_{IN}$ of the first capacitor 1082, the resistance $R_{IN}$ of the first resistor 1081, the resistance $R_{IN1}$ of the second resistor 1085, the capacitance $C_{IN1}$ of the second capacitor 1086, the resistance $R_{IN2}$ of the third resistor 1083, and the capacitance $C_{IN2}$ of the third capacitor 1084.

More specifically, according to the embodiment, after the denominator is determined, the coefficient of $s^2$ of the numerator is controlled by the capacitance $C_{IN}$ of the first capacitor 1082 and the capacitance $C_{IN2}$ of the third capacitor 1084. The coefficient of $s^1$ of the numerator is controlled by the capacitance $C_{IN1}$ of the second capacitor 1086, the capacitance $C_{IN}$ of the first capacitor 1082, the resistance $R_{IN2}$ of the third resistor 1083, and the resistance $R_{IN}$ of the first resistor 1081. The coefficient of $s^0$ is controlled by the resistance $R_{IN1}$ of the second resistor 1085 and the resistance $R_{IN}$ of the first resistor 1081. Accordingly, more components in the resonating device 100 can be used to control the transfer function Vout1/Vin1 of the resonating device 100 in comparison to the conventional counterpart. Therefore, the resonating device 100 is a wide tuning range resonator.

In addition, according to the embodiment, the tunable components, i.e. the first resistor 1081 and the first capacitor 1082, of the gain adjusting circuit 108 are directly connected to the first input terminal N1 of the amplifying circuit 102, wherein the first input terminal N1 is virtual ground. Such connection can reduce the affection to the input signal Vin1 because the voltage swing at the first input terminal N1 is almost zero when the first resistor 1081 and the first capacitor 1082 are adjusted. Accordingly, the linearity of the resonating device 100 can also be improved.

It should be noted that, in this embodiment, the third resistor 1046 and the third capacitor 1066 are arranged to make the first equivalent impedance on the first intermediate terminal N5 in the first feedback circuit 104 substantially equals the second equivalent impedance on the second intermediate terminal N6 in the second feedback circuit 106. Therefore, the third resistor 1046 and the third capacitor 1066 are optional component in this embodiment.

Figure 2:
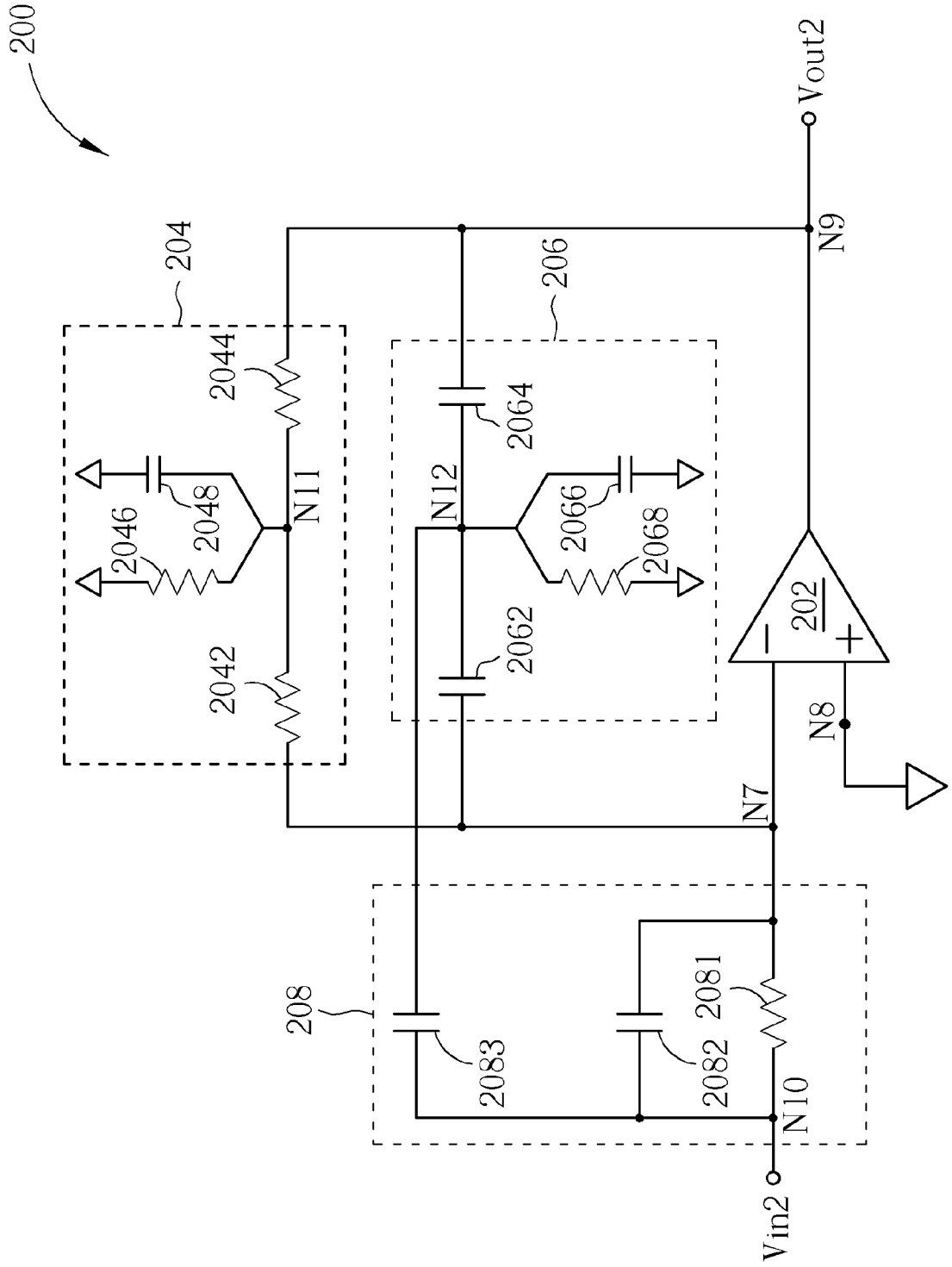
FIG. 2 is a diagram illustrating a resonating device according to a second embodiment of the present invention.

Please refer to FIG. 2, which is a diagram illustrating a resonating device 200 according to a second embodiment of the present invention. The resonating device 200 comprises an amplifying circuit 202, a first feedback circuit 204, a second feedback circuit 206, and a gain adjusting circuit 208. In this embodiment, the amplifying circuit 202, the first feedback circuit 204, and the second feedback circuit 206 are similar to the above-mentioned amplifying circuit 102, the first feedback circuit 104, and the second feedback circuit 106 respectively, therefore the detailed description is omitted here for brevity.

In this embodiment, the gain adjusting circuit 208 comprises a resistor 2081, a first capacitor 2082, and a second capacitor 2083. The resistor 2081 has a first terminal for receiving the input signal Vin2, and a second terminal coupled to the first input terminal N7 of the amplifying circuit 202. The first capacitor 2082 has a first terminal for receiving the input signal Vin2, and a second terminal coupled to the first input terminal N7 of the amplifying circuit 202. The second capacitor 2083 has a first terminal for receiving the input signal Vin2, and a second terminal coupled to the second intermediate terminal N12 of the second feedback circuit 206.

To make the resonating device 200 to act as a resonator, the first equivalent impedance on the first intermediate terminal N11 in the first feedback circuit 204 substantially equals the second equivalent impedance on the second intermediate terminal N12 in the second feedback circuit 206. In other words, both the first equivalent impedance and the second equivalent impedance are designed to have the same resistance $R_{P2}$ and the same capacitance $C_{P2}$ as illustrated by the following equations (4) and (5):

$$R_1 \| R_2 \| R_A = R_3 = R_{P2} \quad (4)$$

$$C_1 + C_2 + C_{IN2} + C_A = C_3 C_{P2} \quad (5)$$

In equations (4) and (5), $R_1$ represents the resistance of the first resistor 2042, $R_2$ represents the resistance of the second resistor 2044, $R_A$ represents the resistance of the third resistor 2046, $R_3$ represents the resistance of the resistor 2068, $C_1$ represents the capacitance of the first capacitor 2062, $C_2$ represents the capacitance of the second capacitor 2064, $C_{IN2}$ represents the capacitance of the second capacitor 2083, $C_A$ represents the capacitance of the third capacitor 2066, and $C_3$ represents the capacitance of the capacitor 2048.

Then, the transfer function, i.e. Vout2/Vin2, from the input signal Vin2 to the output signal Vout2 can be illustrated by the following equation (6):

$$\frac{Vout2}{Vin2} = \frac{\left(\frac{C_{P2}C_{IN}}{C_1 C_2} + \frac{C_{IN2}}{C_2}\right)s^2 + \left(\frac{C_{IN}}{C_1 C_2 R_{P2}} + \frac{C_{P2}}{C_1 C_2 R_{IN}}\right)s + \left(\frac{1}{R_{P2} R_{IN} C_1 C_2}\right)}{s^2 + \frac{1}{R_1 R_2 C_1 C_2}} \quad (6)$$

$C_{IN}$ represents the capacitance of the first capacitor 2082, and $R_{IN}$ represents the resistance of the resistor 2081. According to equation (6), the denominator of the transfer function Vout2/Vin2 is controlled by the first feedback circuit 204 and the second feedback circuit 206, and the numerator of the transfer function Vout2/Vin2 can be adjusted by the gain adjusting circuit 208 after the denominator is determined. In other words, the denominator is determined by the resistance $R_1$ of the first resistor 2042, the resistance $R_2$ of the second resistor 2044, the capacitance $C_1$ of the first capacitor 2062, and the capacitance $C_2$ of the second capacitor 2064. The numerator can be adjusted by the capacitance $C_{IN}$ of the first capacitor 2082, the resistance $R_{IN}$ of the resistor 2081, and the capacitance $C_{IN2}$ of the second capacitor 2083.

More specifically, according to the embodiment, after the denominator is determined, the coefficient of $s^2$ of the numerator is controlled by the capacitance $C_{IN}$ of the first capacitor 2082 and the capacitance $C_{IN2}$ of the second capacitor 2083. The coefficient of $s^1$ of the numerator is controlled by the capacitance $C_{IN}$ of the first capacitor 2082, and the resistance $R_{IN}$ of the resistor 2081. The coefficient of $s^0$ is controlled by the resistance $R_{IN}$ of the resistor 2081. Accordingly, more components in the resonating device 200 can be used to control the transfer function Vout2/Vin2 of the resonating device 200 in comparison to the conventional counterpart. Therefore, the resonating device 200 is a wide tuning range resonator.

In addition, according to the embodiment, the tunable components, i.e. the resistor 2081 and the first capacitor 2082, of the gain adjusting circuit 208 are directly connected to the first input terminal N7 of the amplifying circuit 202, wherein the first input terminal N7 is virtual ground. Such connection can reduce the affection to the input signal Vin2 because the voltage swing at the first input terminal N7 is almost zero when the resistor 2081 and the first capacitor 2082 are adjusted. Accordingly, the linearity of the resonating device 200 can also be improved.

Figure 3:
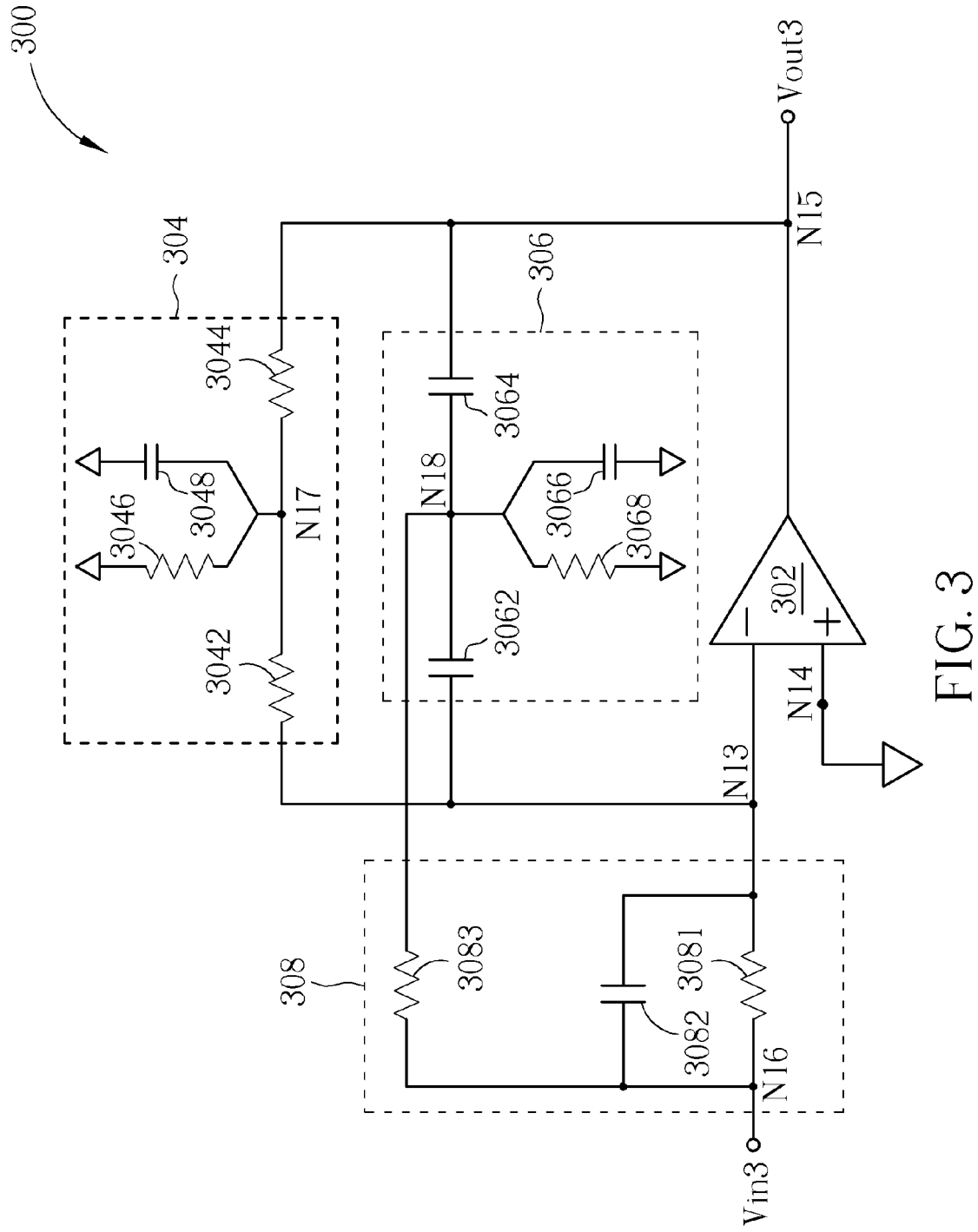
FIG. 3 is a diagram illustrating a resonating device according to a third embodiment of the present invention.

Please refer to FIG. 3, which is a diagram illustrating a resonating device 300 according to a third embodiment of the present invention. The resonating device 300 comprises an amplifying circuit 302, a first feedback circuit 304, a second feedback circuit 306, and a gain adjusting circuit 308. In this embodiment, the amplifying circuit 302, the first feedback circuit 304, and the second feedback circuit 306 are similar to the above-mentioned amplifying circuit 102, the first feedback circuit 104, and the second feedback circuit 106 respectively, therefore the detailed description is omitted here for brevity.

In this embodiment, the gain adjusting circuit 308 comprises a first resistor 3081, a capacitor 3082, and a second resistor 3083. The first resistor 3081 has a first terminal for receiving the input signal Vin3, and a second terminal coupled to the first input terminal N13 of the amplifying circuit 302. The capacitor 3082 has a first terminal for receiving the input signal Vin3, and a second terminal coupled to the first input terminal N13 of the amplifying circuit 302. The second resistor 3083 has a first terminal for receiving the input signal Vin3, and a second terminal coupled to the second intermediate terminal N18 of the second feedback circuit 306.

To make the resonating device 300 to act as a resonator, the first equivalent impedance on the first intermediate terminal N17 in the first feedback circuit 304 substantially equals the second equivalent impedance on the second intermediate terminal N18 in the second feedback circuit 306. In other words, both the first equivalent impedance and the second equivalent impedance are designed to have the same resistance $R_{P3}$ and the same capacitance $C_{P3}$ as illustrated by the following equations (7) and (8):

$$R_1 \| R_2 \| R_A = R_3 \| R_{IN2} = R_{P3} \quad (7)$$

$$C_1 + C_2 + C_A = C_3 = C_{P3} \quad (8)$$

In equations (7) and (8), $R_1$ represents the resistance of the first resistor 3042, $R_2$ represents the resistance of the second resistor 3044, $R_A$ represents the resistance of the third resistor 3046, $R_3$ represents the resistance of the resistor 3068, $R_{IN2}$ represents the resistance of the second resistor 3083, $C_1$ represents the capacitance of the first capacitor 3062, $C_2$ represents the capacitance of the second capacitor 3064, $C_A$ represents the capacitance of the third capacitor 3066, and $C_3$ represents the capacitance of the capacitor 3048.

Then, the transfer function, i.e. Vout3/Vin3, from the input signal Vin3 to the output signal Vout3 can be illustrated by the following equation (9):

$$\frac{Vout3}{Vin3} = \frac{\left(\frac{C_{P3}C_{IN}}{C_1C_2}\right)s^2 + \left(\frac{C_{IN}}{C_1C_2R_{P3}} + \frac{1}{R_{IN2}C_2} + \frac{C_{P3}}{C_1C_2R_{IN}}\right)s + \left(\frac{1}{R_{P3}R_{IN}C_1C_2}\right)}{s^2 + \frac{1}{R_1R_2C_1C_2}} \quad (9)$$

$C_{IN}$ represents the capacitance of the capacitor 3082, and $R_{IN}$ represents the resistance of the first resistor 3081. According to equation (9), the denominator of the transfer function Vout3/Vin3 is controlled by the first feedback circuit 304 and the second feedback circuit 306, and the numerator of the transfer function Vout3/Vin3 can be adjusted by the gain adjusting circuit 308 after the denominator is determined. In other words, the denominator is determined by the resistance $R_1$ of the first resistor 3042, the resistance $R_2$ of the second resistor 3044, the capacitance $C_1$ of the first capacitor 3062, and the capacitance $C_2$ of the second capacitor 3064. The numerator can be adjusted by the capacitance $C_{IN}$ of the capacitor 3082, the resistance $R_{IN}$ of the first resistor 3081, and the resistance $R_{IN2}$ of the second resistor 3083.

More specifically, according to the embodiment, after the denominator is determined, the coefficient of $s^2$ of the numerator is controlled by the capacitance $C_{IN}$ of the capacitor 3082. The coefficient of $s^1$ of the numerator is controlled by the capacitance $C_{IN}$ of the capacitor 3082, the resistance $R_{IN2}$ of the second resistor 3083, and the resistance $R_{IN}$ of the first resistor 3081. The coefficient of $s^0$ is controlled by the resistance $R_{IN}$ of the first resistor 3081. Accordingly, more components in the resonating device 300 can be used to control the transfer function Vout3/Vin3 of the resonating device 300 in comparison to the conventional counterpart. Therefore, the resonating device 300 is a wide tuning range resonator.

In addition, according to the embodiment, the tunable components, i.e. the first resistor 3081 and the capacitor 3082, of the gain adjusting circuit 308 are directly connected to the first input terminal N13 of the amplifying circuit 302, wherein the first input terminal N13 is virtual ground. Such connection can reduce the affection to the input signal Vin3 because the voltage swing at the first input terminal N13 is almost zero when the first resistor 3081 and the capacitor 3082 are adjusted. Accordingly, the linearity of the resonating device 300 can also be improved.

Figure 4:
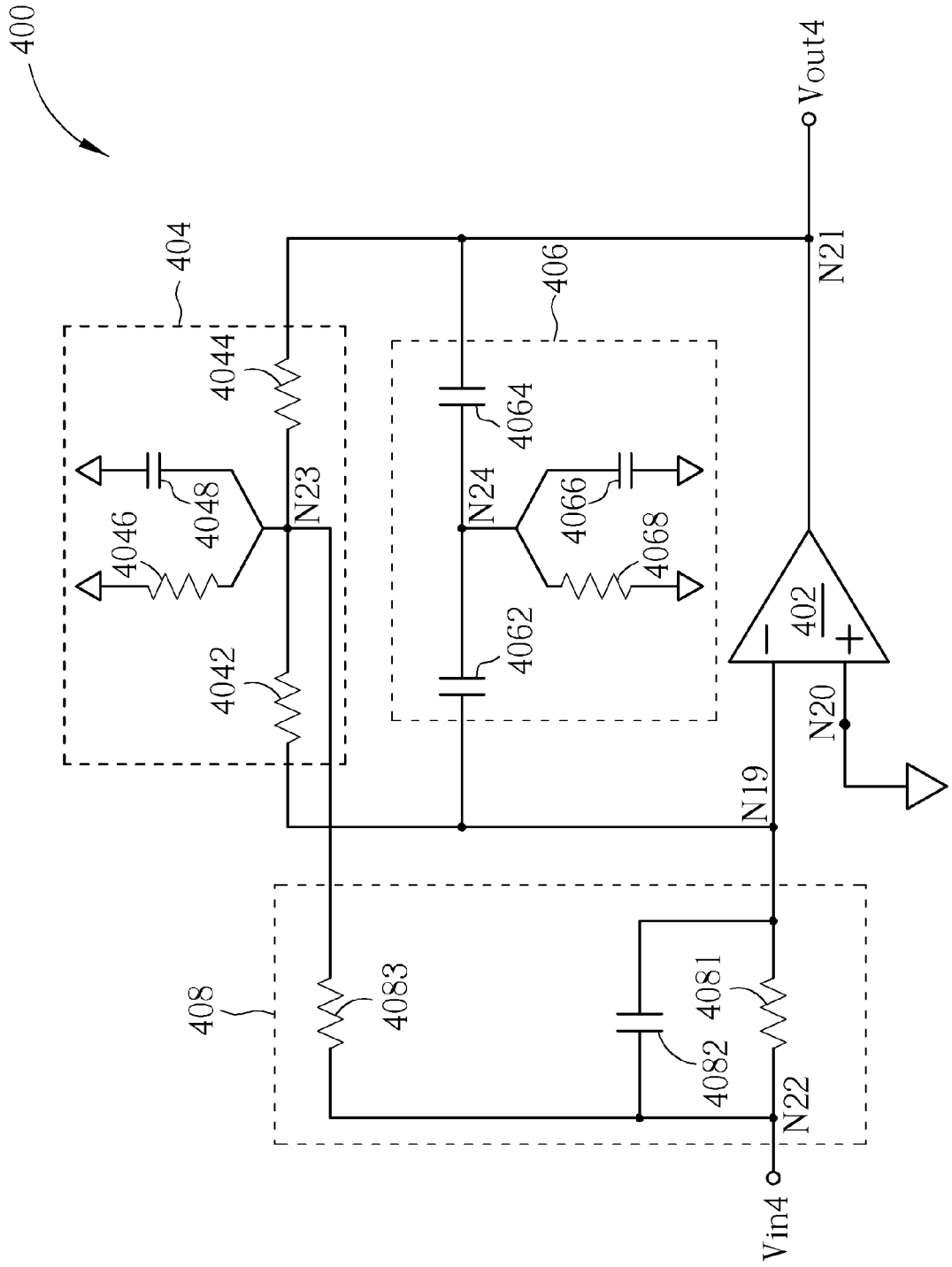
FIG. 4 is a diagram illustrating a resonating device according to a fourth embodiment of the present invention.

Please refer to FIG. 4, which is a diagram illustrating a resonating device 400 according to a fourth embodiment of the present invention. The resonating device 400 comprises an amplifying circuit 402, a first feedback circuit 404, a second feedback circuit 406, and a gain adjusting circuit 408. In this embodiment, the amplifying circuit 402, the first feedback circuit 404, and the second feedback circuit 406 are similar to the above-mentioned amplifying circuit 102, the first feedback circuit 104, and the second feedback circuit 106 respectively, therefore the detailed description is omitted here for brevity.

In this embodiment, the gain adjusting circuit 408 comprises a first resistor 4081, a capacitor 4082, and a second resistor 4083. The first resistor 4081 has a first terminal for receiving the input signal Vin4, and a second terminal coupled to the first input terminal N19 of the amplifying circuit 402. The capacitor 4082 has a first terminal for receiving the input signal Vin4, and a second terminal coupled to the first input terminal N19 of the amplifying circuit 402. The second resistor 4083 has a first terminal for receiving the input signal Vin4, and a second terminal coupled to the first intermediate terminal N23 of the first feedback circuit 404.

To make the resonating device 400 to act as a resonator, the first equivalent impedance on the first intermediate terminal N23 in the first feedback circuit 404 substantially equals the second equivalent impedance on the second intermediate terminal N24 in the second feedback circuit 406. In other words, both the first equivalent impedance and the second equivalent impedance are designed to have the same resistance $R_{P4}$ and the same capacitance $C_{P4}$ as illustrated by the following equations (10) and (11):

$$R_1 \| R_2 \| R_{IN1} \| R_4 = R_3 = R_{P4} \quad (10)$$

$$C_1 + C_2 + C_4 = C_3 = C_{P4} \quad (11)$$

In equations (10) and (11), $R_1$ represents the resistance of the first resistor 4042, $R_2$ represents the resistance of the second resistor 4044, $R_{IN1}$ represents the resistance of the second resistor 4083, $R_4$ represents the resistance of the third resistor 4046, $R_3$ represents the resistance of the resistor 4068, $C_1$ represents the capacitance of the first capacitor 4062, $C_2$ represents the capacitance of the second capacitor 4064, $C_4$ represents the capacitance of the third capacitor 4066, and $C_3$ represents the capacitance of the capacitor 4048.

Then, the transfer function, i.e. Vout4/Vin4, from the input signal Vin4 to the output signal Vout4 can be illustrated by the following equation (12):

$$\frac{Vout4}{Vin4} = \frac{\left(\frac{C_{P4}C_{IN}}{C_1C_2}\right)s^2 + \left(\frac{C_{IN}}{C_1C_2R_{P4}} + \frac{C_{P4}}{C_1C_2R_{IN}}\right)s + \left(\frac{1}{R_1R_{IN1}C_1C_2} + \frac{1}{R_{P4}R_{IN}C_1C_2}\right)}{s^2 + \frac{1}{R_1R_2C_1C_2}} \quad (12)$$

$C_{IN}$ represents the capacitance of the capacitor 4082, and $R_{IN}$ represents the resistance of the first resistor 4081. According to equation (12), the denominator of the transfer function Vout4/Vin4 is controlled by the first feedback circuit 404 and the second feedback circuit 406, and the numerator of the transfer function Vout4/Vin4 can be adjusted by the gain adjusting circuit 408 after the denominator is determined. In other words, the denominator is determined by the resistance $R_1$ of the first resistor 4042, the resistance $R_2$ of the second resistor 4044, the capacitance $C_1$ of the first capacitor 4062, and the capacitance $C_2$ of the second capacitor 4064. The numerator can be adjusted by the capacitance $C_{IN}$ of the capacitor 4082, the resistance $R_{IN}$ of the first resistor 4081, and the resistance $R_{IN1}$ of the second resistor 4083.

More specifically, according to the embodiment, after the denominator is determined, the coefficient of $s^2$ of the numerator is controlled by the capacitance $C_{IN}$ of the capacitor 4082. The coefficient of $s^1$ of the numerator is controlled by the capacitance $C_{IN}$ of the capacitor 4082 and the resistance $R_{IN}$ of the first resistor 4081. The coefficient of $s^0$ is controlled by the resistance $R_{IN1}$ of the second resistor 4083 and the resistance $R_{IN}$ of the first resistor 4081. Accordingly, more components in the resonating device 400 can be used to control the transfer function Vout4/Vin4 of the resonating device 400 in comparison to the conventional counterpart. Therefore, the resonating device 400 is a wide tuning range resonator.

In addition, according to the embodiment, the tunable components, i.e. the first resistor 4081 and the capacitor 4082, of the gain adjusting circuit 408 are directly connected to the first input terminal N19 of the amplifying circuit 402, wherein the first input terminal N19 is virtual ground. Such connection can reduce the affection to the input signal Vin4 because the voltage swing at the first input terminal N19 is almost zero when the first resistor 4081 and the capacitor 4082 are adjusted. Accordingly, the linearity of the resonating device 400 can also be improved.

Figure 5:
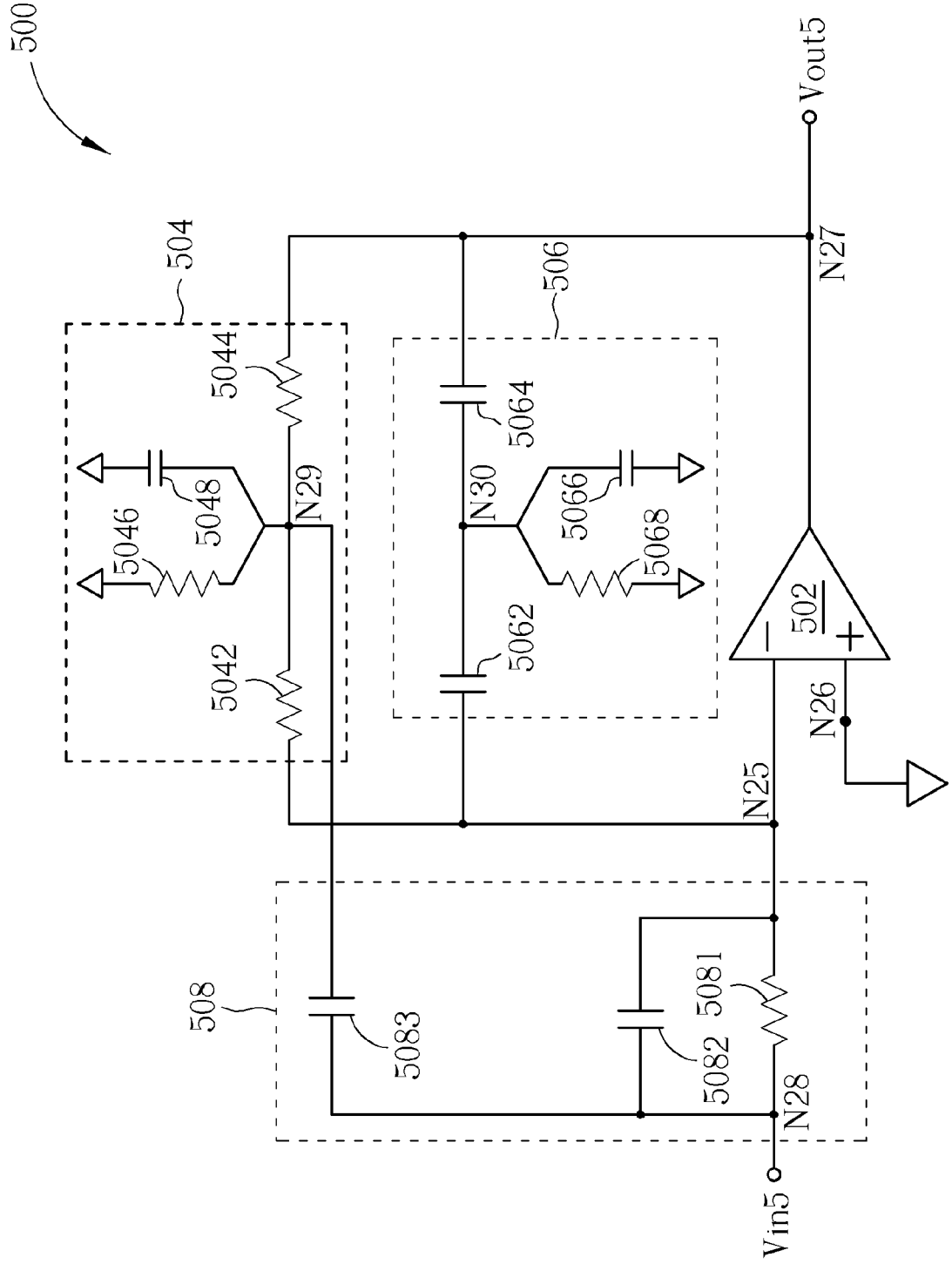
FIG. 5 is a diagram illustrating a resonating device according to a fifth embodiment of the present invention.

Please refer to FIG. 5, which is a diagram illustrating a resonating device 500 according to a fifth embodiment of the present invention. The resonating device 500 comprises an amplifying circuit 502, a first feedback circuit 504, a second feedback circuit 506, and a gain adjusting circuit 508. In this embodiment, the amplifying circuit 502, the first feedback circuit 504, and the second feedback circuit 506 are similar to the above-mentioned amplifying circuit 102, the first feedback circuit 104, and the second feedback circuit 106 respectively, therefore the detailed description is omitted here for brevity.

In this embodiment, the gain adjusting circuit 508 comprises a resistor 5081, a first capacitor 5082, and a second capacitor 5083. The resistor 5081 has a first terminal for receiving the input signal Vin5, and a second terminal coupled to the first input terminal N25 of the amplifying circuit 502. The first capacitor 5082 has a first terminal for receiving the input signal Vin5, and a second terminal coupled to the first input terminal N25 of the amplifying circuit 502. The second capacitor 5083 has a first terminal for receiving the input signal Vin5, and a second terminal coupled to the first intermediate terminal N29 of the first feedback circuit 504.

To make the resonating device 500 to act as a resonator, the first equivalent impedance on the first intermediate terminal N29 in the first feedback circuit 504 substantially equals the second equivalent impedance on the second intermediate terminal N30 in the second feedback circuit 506. In other words, both the first equivalent impedance and the second equivalent impedance are designed to have the same resistance $R_{P5}$ and the same capacitance $C_{P5}$ as illustrated by the following equations (13) and (14):

$$R_1 \| R_2 \| R_A = R_3 = R_{P5} \quad (13)$$

$$C_1 + C_2 + C_A = C_3 + C_{IN1} = C_{P5} \quad (14)$$

In equations (13) and (14), $R_1$ represents the resistance of the first resistor 5042, $R_2$ represents the resistance of the second resistor 5044, $R_A$ represents the resistance of the third resistor 5046, $R_3$ represents the resistance of the resistor 5068, $C_1$ represents the capacitance of the first capacitor 5062, $C_2$ represents the capacitance of the second capacitor 5064, $C_A$ represents the capacitance of the third capacitor 5066, and $C_3$ represents the capacitance of the capacitor 5048, $C_{IN1}$ represents the capacitance of the second capacitor 5083.

Then, the transfer function, i.e. Vout5/Vin5, from the input signal Vin5 to the output signal Vout5 can be illustrated by the following equation (15):

$$\frac{Vout5}{Vin5} = \frac{\left(\frac{C_{P5}C_{IN}}{C_1C_2}\right)s^2 + \left(\frac{C_{IN1}}{C_1C_2R_1} + \frac{C_{IN}}{C_1C_2R_{P5}} + \frac{C_{P5}}{C_1C_2R_{IN}}\right)s + \left(\frac{1}{R_{P5}R_{IN}C_1C_2}\right)}{s^2 + \frac{1}{R_1R_2C_1C_2}} \quad (15)$$

$C_{IN}$ represents the capacitance of the first capacitor 5082, and $R_{IN}$ represents the resistance of the resistor 5081. According to equation (15), the denominator of the transfer function Vout5/Vin5 is controlled by the first feedback circuit 504 and the second feedback circuit 506, and the numerator of the transfer function Vout5/Vin5 can be adjusted by the gain adjusting circuit 508 after the denominator is determined. In other words, the denominator is determined by the resistance $R_1$ of the first resistor 5042, the resistance $R_2$ of the second resistor 5044, the capacitance $C_1$ of the first capacitor 5062, and the capacitance $C_2$ of the second capacitor 5064. The numerator can be adjusted by the capacitance $C_{IN}$ of the first capacitor 5082, the resistance $R_{IN}$ of the resistor 5081, and the capacitance $C_{IN1}$ of the second capacitor 5083.

More specifically, according to the embodiment, after the denominator is determined, the coefficient of $s^2$ of the numerator is controlled by the capacitance $C_{IN}$ of the first capacitor 5082. The coefficient of $s^1$ of the numerator is controlled by the capacitance $C_{IN1}$ of the second capacitor 5083, the capacitance $C_{IN}$ of the first capacitor 5082, and the resistance $R_{IN}$ of the resistor 5081. The coefficient of $s^0$ is controlled by the resistance $R_{IN}$ of the resistor 5081. Accordingly, more components in the resonating device 500 can be used to control the transfer function Vout5/Vin5 of the resonating device 500 in comparison to the conventional counterpart. Therefore, the resonating device 500 is a wide tuning range resonator.

In addition, according to the embodiment, the tunable components, i.e. the resistor 5081 and the first capacitor 5082, of the gain adjusting circuit 508 are directly connected to the first input terminal N25 of the amplifying circuit 502, wherein the first input terminal N25 is virtual ground. Such connection can reduce the affection to the input signal Vin5 because the voltage swing at the first input terminal N25 is almost zero when the resistor 5081 and the first capacitor 5082 are adjusted. Accordingly, the linearity of the resonating device 500 can also be improved.

Figure 6:
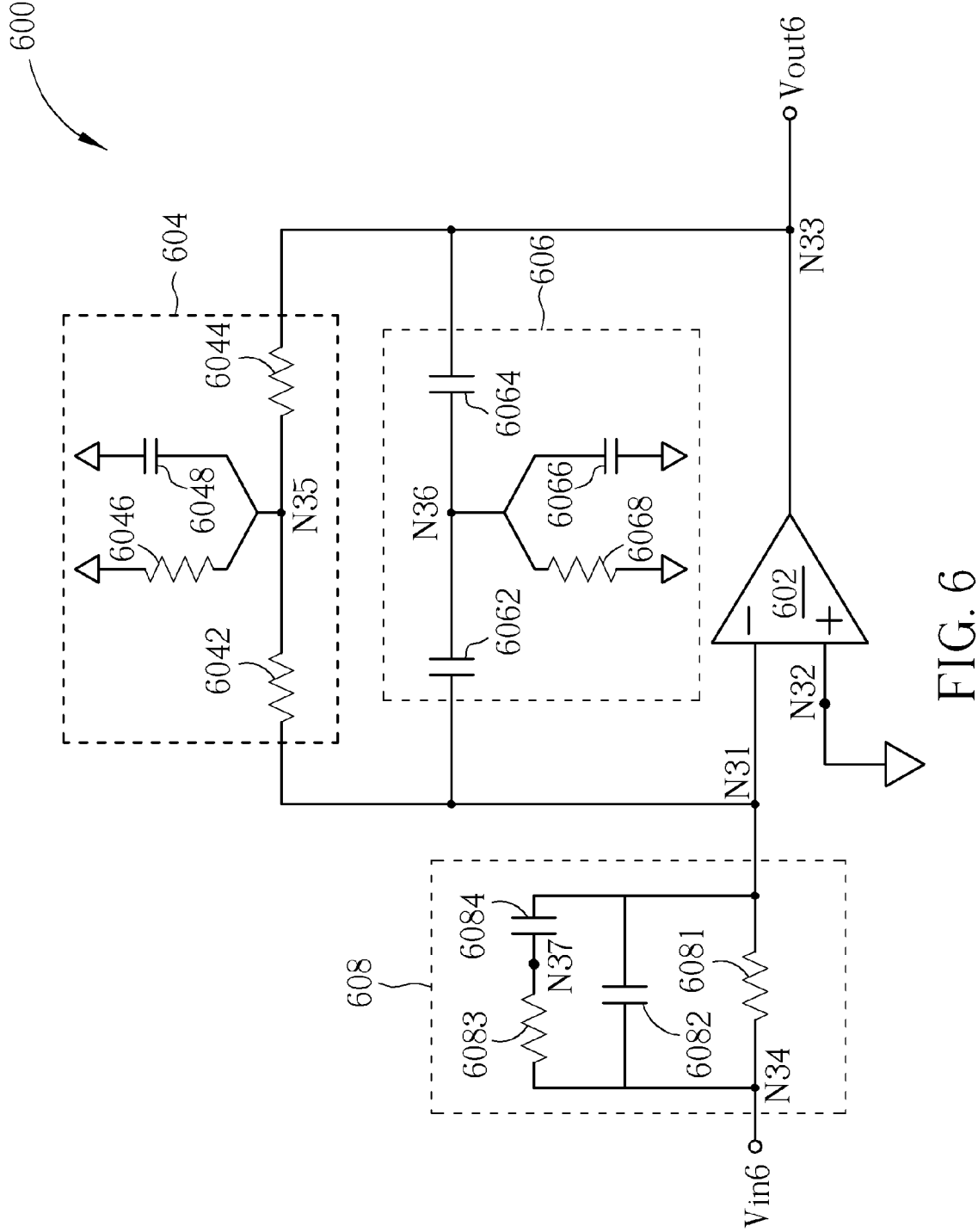
FIG. 6 is a diagram illustrating a resonating device according to a sixth embodiment of the present invention.

Please refer to FIG. 6, which is a diagram illustrating a resonating device 600 according to a sixth embodiment of the present invention. The resonating device 600 comprises an amplifying circuit 602, a first feedback circuit 604, a second feedback circuit 606, and a gain adjusting circuit 608. In this embodiment, the amplifying circuit 602, the first feedback circuit 604, and the second feedback circuit 606 are similar to the above-mentioned amplifying circuit 102, the first feedback circuit 104, and the second feedback circuit 106 respectively, therefore the detailed description is omitted here for brevity.

In this embodiment, the gain adjusting circuit 608 comprises a first resistor 6081, a first capacitor 6082, a second resistor 6083, and a second capacitor 6084. The first resistor 6081 has a first terminal for receiving the input signal Vin6, and a second terminal coupled to the first input terminal N31 of the amplifying circuit 602. The first capacitor 6082 has a first terminal for receiving the input signal Vin6, and a second terminal coupled to the first input terminal N31 of the amplifying circuit 602. The second resistor 6083 has a first terminal for receiving the input signal Vin6. The second capacitor 6084 has a first terminal coupled to a second terminal N37 of the second resistor 6083, and a second terminal coupled to the first input terminal N31 of the amplifying circuit 602.

To make the resonating device 600 to act as a resonator, the first equivalent impedance on the first intermediate terminal N35 in the first feedback circuit 604 substantially equals the second equivalent impedance on the second intermediate terminal N36 in the second feedback circuit 606. In other words, both the first equivalent impedance and the second equivalent impedance are designed to have the same resistance $R_{P6}$ and the same capacitance $C_{P6}$ as illustrated by the following equations (16) and (17):

$$R_1 \| R_2 \| R_A = R_3 = R_{P6} \quad (16)$$

$$C_1 + C_2 + C_A = C_3 = C_{P6} \quad (17)$$

In equations (16) and (17), $R_1$ represents the resistance of the first resistor 6042, $R_2$ represents the resistance of the second resistor 6044, $R_A$ represents the resistance of the third resistor 6046, $R_3$ represents the resistance of the resistor 6068, $C_1$ represents the capacitance of the first capacitor 6062, $C_2$ represents the capacitance of the second capacitor 6064, $C_A$ represents the capacitance of the third capacitor 6066, and $C_3$ represents the capacitance of the capacitor 6048.

Then, if the product of the resistance $R_S$ of the second resistor 6083 and the capacitance $C_S$ of the second capacitor 6084 equals the product of the resistance $R_{P6}$ and the capacitance $C_{P6}$ (i.e. the equation (18) as illustrated below), then the transfer function, i.e. Vout6/Vin6, from the input signal Vin6 to the output signal Vout6 can be illustrated by the following equation (19):

$$R_S * C_S = R_{P6} * C_{P6} \quad (18)$$

$$\frac{Vout6}{Vin6} = \frac{\left(\frac{C_{P6} C_{IN}}{C_1 C_2}\right) s^2 + \left(\frac{C_S}{C_1 C_2 R_{P6}} + \frac{C_{IN}}{C_1 C_2 R_{P6}} + \frac{C_{P6}}{C_1 C_2 R_{IN}}\right) s + \left(\frac{1}{R_{P6} R_{IN} C_1 C_2}\right)}{s^2 + \frac{1}{R_1 R_2 C_1 C_2}} \quad (19)$$

$C_{IN}$ represents the capacitance of the first capacitor 6082, and $R_{IN}$ represents the resistance of the first resistor 6081. According to equation (19), the denominator of the transfer function Vout6/Vin6 is controlled by the first feedback circuit 604 and the second feedback circuit 606, and the numerator of the transfer function Vout6/Vin6 can be adjusted by the gain adjusting circuit 608 after the denominator is determined. In other words, the denominator is determined by the resistance $R_1$ of the first resistor 6042, the resistance $R_2$ of the second resistor 6044, the capacitance $C_1$ of the first capacitor 6062, and the capacitance $C_2$ of the second capacitor 6064. The numerator can be adjusted by the capacitance $C_{IN}$ of the first capacitor 6082, the resistance $R_{IN}$ of the resistor 6081, and the capacitance $C_S$ of the second capacitor 6084.

More specifically, according to the embodiment, after the denominator is determined, the coefficient of $s^2$ of the numerator is controlled by the capacitance $C_{IN}$ of the first capacitor 6082. The coefficient of $s^1$ of the numerator is controlled by the capacitance $C_S$ of the second capacitor 6084, the capacitance $C_{IN}$ of the first capacitor 6082, and the resistance $R_{IN}$ of the first resistor 6081. The coefficient of $s^0$ is controlled by the resistance $R_{IN}$ of the first resistor 6081. Accordingly, more components in the resonating device 600 can be used to control the transfer function Vout6/Vin6 of the resonating device 600 in comparison to the conventional counterpart. Therefore, the resonating device 600 is a wide tuning range resonator.

In addition, according to the embodiment, the tunable components, i.e. the resistors 6081, 6083 and the capacitors 6082, 6084, of the gain adjusting circuit 608 are directly connected to the first input terminal N31 of the amplifying circuit 602, wherein the first input terminal N31 is virtual ground. Such connection can reduce the affection to the input signal Vin6 because the voltage swing at the first input terminal N31 is almost zero when the resistors 6081, 6083 and the capacitors 6082, 6084 are adjusted. Accordingly, the linearity of the resonating device 600 can also be improved. Moreover, the adjustment of the resistors 6081, 6083 and the capacitors 6082, 6084 does not affect/alter the impedances on the first intermediate terminal N35 and the second intermediate terminal N36.

Figure 7:
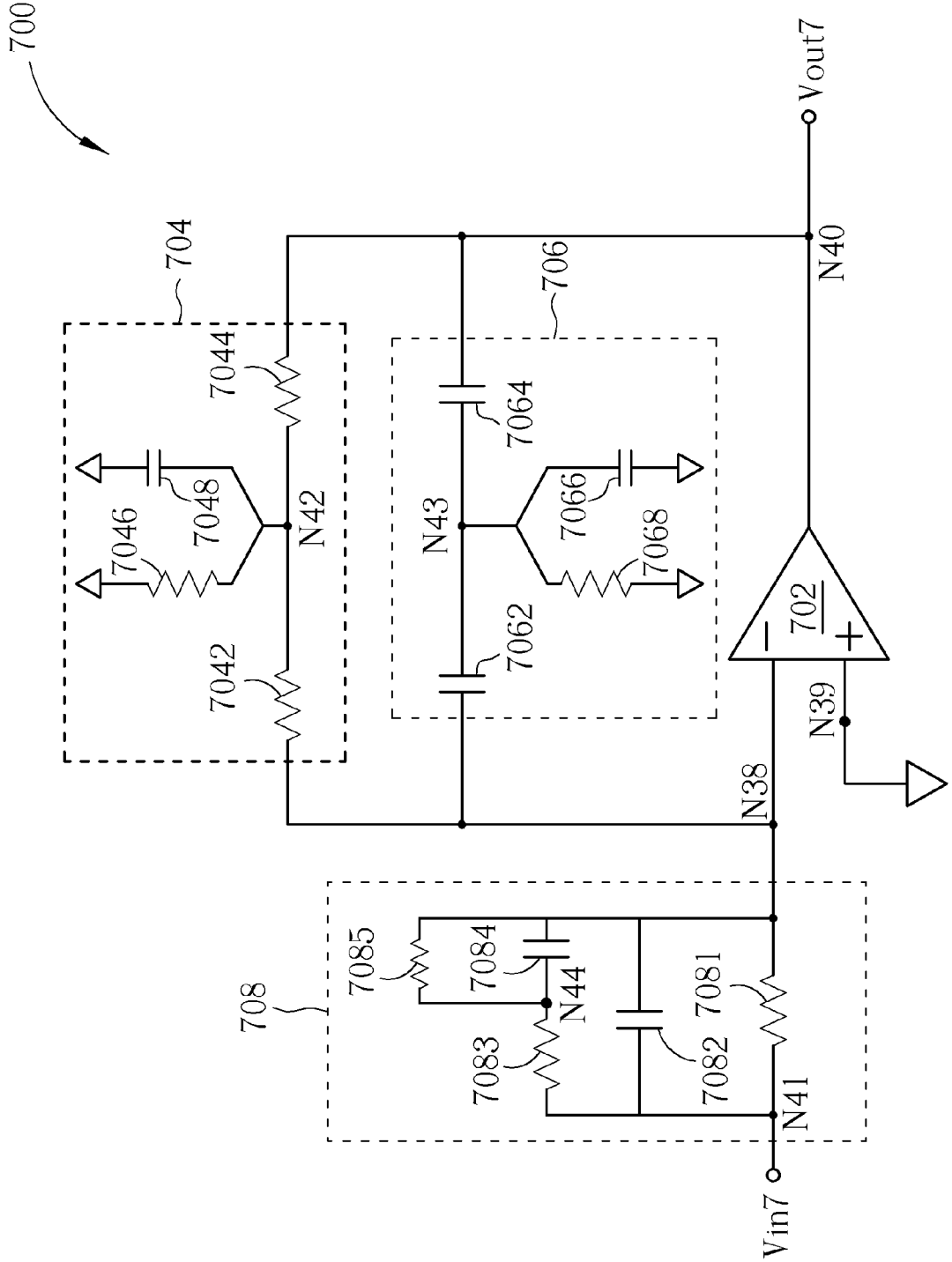
FIG. 7 is a diagram illustrating a resonating device according to a seventh embodiment of the present invention.

Please refer to FIG. 7, which is a diagram illustrating a resonating device 700 according to a seventh embodiment of the present invention. The resonating device 700 comprises an amplifying circuit 702, a first feedback circuit 704, a second feedback circuit 706, and a gain adjusting circuit 708. In this embodiment, the amplifying circuit 702, the first feedback circuit 704, and the second feedback circuit 706 are similar to the above-mentioned amplifying circuit 102, the first feedback circuit 104, and the second feedback circuit 106 respectively, therefore the detailed description is omitted here for brevity.

In this embodiment, the gain adjusting circuit 708 comprises a first resistor 7081, a first capacitor 7082, a second resistor 7083, a second capacitor 7084, and a third resistor 7085. The first resistor 7081 has a first terminal for receiving the input signal Vin7, and a second terminal coupled to the first input terminal N38 of the amplifying circuit 702. The first capacitor 7082 has a first terminal for receiving the input signal Vin7, and a second terminal coupled to the first input terminal N38 of the amplifying circuit 702. The second resistor 7083 has a first terminal for receiving the input signal Vin7. The second capacitor 7084 has a first terminal coupled to a second terminal N44 of the second resistor 7083, and a second terminal coupled to the first input terminal N38 of the amplifying circuit 702. The third resistor 7085 has a first terminal coupled to the second terminal N44 of the second resistor 7083, and a second terminal coupled to the first input terminal N38 of the amplifying circuit 702.

To make the resonating device 700 to act as a resonator, the first equivalent impedance on the first intermediate terminal N42 in the first feedback circuit 704 substantially equals the second equivalent impedance on the second intermediate terminal N43 in the second feedback circuit 706. In other words, both the first equivalent impedance and the second equivalent impedance are designed to have the same resistance $R_{P7}$ and the same capacitance $C_{P1}$ as illustrated by the following equations (20) and (21):

$$R_1 \| R_2 \| R_A = R_3 = R_{P7} \quad (20)$$

$$C_1 + C_2 + C_A = C_3 = C_{P7} \quad (21)$$

In equations (20) and (21), $R_1$ represents the resistance of the first resistor 7042, $R_2$ represents the resistance of the second resistor 7044, $R_A$ represents the resistance of the third resistor 7046, $R_3$ represents the resistance of the resistor 7068, $C_1$ represents the capacitance of the first capacitor 7062, $C_2$ represents the capacitance of the second capacitor 7064, $C_A$ represents the capacitance of the third capacitor 7066, and $C_3$ represents the capacitance of the capacitor 7048.

Then, if the following equation (22) is true, then the transfer function, i.e. Vout7/Vin7, from the input signal Vin7 to the output signal Vout7 can be illustrated by the following equation (23):

$$\frac{R_{S1}R_{S2}}{R_{S1}+R_{S2}}C_S = R_{P7} * C_{P7} \qquad (22)$$

$$\frac{Vout7}{Vin7} = \frac{\left(\frac{C_{P7}C_{IN}}{C_1C_2}\right)s^2 + \left(\frac{R_{S2}C_S}{C_1C_2R_{P7}(R_{S1}+R_{S2})} + \frac{C_{IN}}{C_1C_2R_{P7}} + \frac{C_{P7}}{C_1C_2R_{IN}}\right)s + \left(\frac{1}{R_{P7}(R_{S1}+R_{S2})C_1C_2} + \frac{1}{R_{P7}R_{IN}C_1C_2}\right)}{s^2 + \frac{1}{R_1R_2C_1C_2}} \qquad (23)$$

$R_{S1}$ represents the resistance of the second resistor 7083, $R_{S2}$ represents the resistance of the third resistor 7085, $C_S$ represents the capacitance of the second capacitor 7084, $C_{IN}$ represents the capacitance of the first capacitor 7082, and $R_{IN}$ represents the resistance of the first resistor 7081. According to equation (23), the denominator of the transfer function Vout7/Vin7 is controlled by the first feedback circuit 704 and the second feedback circuit 706, and the numerator of the transfer function Vout7/Vin7 can be adjusted by the gain adjusting circuit 708 after the denominator is determined. In other words, the denominator is determined by the resistance $R_1$ of the first resistor 7042, the resistance $R_2$ of the second resistor 7044, the capacitance $C_1$ of the first capacitor 7062, and the capacitance $C_2$ of the second capacitor 7064. The numerator can be adjusted by the capacitance $C_{IN}$ of the first capacitor 7082, the resistance $R_{IN}$ of the first resistor 7081, the capacitance $C_S$ of the second capacitor 7084, the resistance $R_{S1}$ of the second resistor 7083, and the resistance $R_{S2}$ of the second resistor 7085.

More specifically, according to the embodiment, after the denominator is determined, the coefficient of $s^2$ of the numerator is controlled by the capacitance $C_{IN}$ of the first capacitor 7082. The coefficient of $s^1$ of the numerator is controlled by the capacitance $C_S$ of the second capacitor 7084, the capacitance $C_{IN}$ of the first capacitor 7082, and the resistance $R_{IN}$ of the first resistor 7081. The coefficient of $s^0$ is controlled by the resistance $R_{IN}$ of the first resistor 7081. Accordingly, more components in the resonating device 700 can be used to control the transfer function Vout7/Vin7 of the resonating device in comparison to the conventional counterpart. Therefore, the resonating device 700 is a wide tuning range resonator.

In addition, according to the embodiment, the tunable components, i.e. the resistors 7081, 7083, 7085 and the capacitors 7082, 7084, of the gain adjusting circuit 708 are directly connected to the first input terminal N38 of the amplifying circuit 702, wherein the first input terminal N38 is virtual ground. Such connection can reduce the affection to the input signal Vin7 because the voltage swing at the first input terminal N38 is almost zero when the resistors 7081, 7083, 7085 and the capacitors 7082, 7084 are adjusted. Accordingly, the linearity of the resonating device 700 can also be improved. Moreover, the adjustment of the resistors 7081, 7083, 7085 and the capacitors 7082, 7084 does not affect/alter the impedances on the first intermediate terminal N42 and the second intermediate terminal N43.

It should be noted that, for illustration purposes, the resonating devices 100, 200, 300, 400, 500, 600, 700 have been simplified into the single-ended versions as shown in FIG. 1-FIG. 7 respectively. Those skilled in the art are appreciated to understand that, in practical, the resonating devices 100, 200, 300, 400, 500, 600, 700 may be implemented as fully-differential devices, and the fully-differential devices also have the similar characteristics and advantages to those single-ended resonating devices as shown in FIG. 1-FIG. 7. For example, if the resonating device 100 is implemented as a fully-differential resonating device, the fully-differential resonating device may further comprise a duplicate of the first feedback circuit 104, a duplicate of the second feedback circuit 106, and a duplicate of the gain adjusting circuit 108. The amplifying circuit 102 now becomes a fully-differential amplifying circuit having two input terminals (+, −) and two output terminals (−, +), in which the first feedback circuit 104, the second feedback circuit 106, and the gain adjusting circuit 108 are coupled between the negative input terminal (−) and the positive output terminal (+), and the duplicate of the first feedback circuit 104, the duplicate of the second feedback circuit 106, and the duplicate of the gain adjusting circuit 108 are coupled between the positive input terminal (+) and the negative output terminal (−). As those skilled in the art are appreciated to understand the operation of the fully-differential version of the resonating devices 100, 200, 300, 400, 500, 600, 700, the detailed description is omitted here for brevity.

Briefly, the above embodiments are single-operational-amplifier resonators. Thus, the presented resonators are low cost resonators. Moreover, by arranging the gain adjusting circuit to couple between the input signal and the amplifying circuit and/or to couple between the input signal and the first feedback circuit and/or the second feedback circuit, the presented resonators could fulfill the required controllability and achieve better linearity performance than the conventional resonator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resonating device, comprising:
an amplifying circuit, having a first input terminal, and an output terminal for outputting an output signal;
a first feedback circuit, coupled between the first input terminal and the output terminal of the amplifying circuit, wherein the first feedback circuit comprise a T-network, and the T-network comprising:
a first resistor, having a first terminal coupled to the first input terminal of the amplifying circuit, and a second terminal coupled to the first intermediate terminal;
a second resistor, having a first terminal coupled to the first intermediate terminal, and a second terminal coupled to the output terminal of the amplifying circuit;
a third resistor, having a first terminal coupled to the first intermediate terminal, and a second terminal coupled to the reference voltage; and
a capacitor, having a first terminal coupled to the first intermediate terminal, and a second terminal coupled to a reference voltage;

a second feedback circuit, coupled between the first input terminal and the output terminal of the amplifying circuit, wherein the second feedback circuit comprise a T-network; and a gain adjusting circuit, having an input terminal for receiving an input signal, and a first output terminal coupled to the first input terminal of the amplifying circuit;

wherein a first equivalent impedance on a first intermediate terminal in the first feedback circuit substantially equals a second equivalent impedance on a second intermediate terminal in the second feedback circuit, and the gain adjusting circuit is arranged to tune a transfer function from the input signal to the output signal.

2. The resonating device of claim 1, wherein the gain adjusting circuit is arranged to tune a numerator of the transfer function.

3. The resonating device of claim 1, wherein the amplifying circuit further comprises a second input terminal, and the second input terminal is coupled to a reference voltage.

4. The resonating device of claim 3, wherein the amplifying circuit is a differential operational amplifier, the first input terminal is a negative input terminal of the differential operational amplifier, and the second input terminal is a positive input terminal of the differential operational amplifier.

5. The resonating device of claim 1, wherein the first input terminal of the amplifying circuit is a virtual-ground terminal.

6. The resonating device of claim 1, wherein the first output terminal of the gain adjusting circuit is directly coupled to the first input terminal of the amplifying circuit.

7. The resonating device of claim 1, wherein the gain adjusting circuit comprises:
a first resistor, having a first terminal for receiving the input signal, and a second terminal coupled to the first input terminal of the amplifying circuit;
a first capacitor, having a first terminal for receiving the input signal, and a second terminal coupled to the first input terminal of the amplifying circuit;
a second resistor, having a first terminal for receiving the input signal; and
a second capacitor, having a first terminal coupled to a second terminal of the second resistor, and a second terminal coupled to the first input terminal of the amplifying circuit.

8. The resonating device of claim 7, wherein the gain adjusting circuit further comprises:
a third resistor, having a first terminal coupled to the first terminal of the second capacitor, and a second terminal coupled to the first input terminal of the amplifying circuit.

9. The resonating device of claim 1, wherein the gain adjusting circuit further comprises a second output terminal coupled to the first intermediate terminal of the first feedback circuit.

10. The resonating device of claim 9, wherein the gain adjusting circuit further comprises:
a first resistor, having a first terminal for receiving the input signal, and a second terminal coupled to the first input terminal of the amplifying circuit;
a first capacitor, having a first terminal for receiving the input signal, and a second terminal coupled to the first input terminal of the amplifying circuit; and
a second capacitor, having a first terminal for receiving the input signal, and a second terminal coupled to the first intermediate terminal of the first feedback circuit.

11. The resonating device of claim 9, wherein the gain adjusting circuit further comprises:
a first resistor, having a first terminal for receiving the input signal, and a second terminal coupled to the first input terminal of the amplifying circuit;
a first capacitor, having a first terminal for receiving the input signal, and a second terminal coupled to the first input terminal of the amplifying circuit; and
a second resistor, having a first terminal for receiving the input signal, and a second terminal coupled to the first intermediate terminal of the first feedback circuit.

12. The resonating device of claim 1, wherein the gain adjusting circuit further comprises a second output terminal coupled to the second intermediate terminal of the second feedback circuit.

13. The resonating device of claim 12, wherein the gain adjusting circuit further comprises:
a first resistor, having a first terminal for receiving the input signal, and a second terminal coupled to the first input terminal of the amplifying circuit;
a first capacitor, having a first terminal for receiving the input signal, and a second terminal coupled to the first input terminal of the amplifying circuit; and
a second capacitor, having a first terminal for receiving the input signal, and a second terminal coupled to the second intermediate terminal of the first feedback circuit.

14. The resonating device of claim 12, wherein the gain adjusting circuit further comprises:
a first resistor, having a first terminal for receiving the input signal, and a second terminal coupled to the first input terminal of the amplifying circuit;
a first capacitor, having a first terminal for receiving the input signal, and a second terminal coupled to the first input terminal of the amplifying circuit; and
a second resistor, having a first terminal for receiving the input signal, and a second terminal coupled to the second intermediate terminal of the first feedback circuit.

15. The resonating device of claim 1, wherein the gain adjusting circuit comprises:
a first resistor, having a first terminal for receiving the input signal, and a second terminal coupled to the first input terminal of the amplifying circuit;
a first capacitor, having a first terminal for receiving the input signal, and a second terminal coupled to the first input terminal of the amplifying circuit;
a second resistor, having a first terminal for receiving the input signal, and a second terminal coupled to the first intermediate terminal of the first feedback circuit;
a second capacitor, having a first terminal for receiving the input signal, and a second terminal coupled to the first intermediate terminal of the first feedback circuit;
a third resistor, having a first terminal for receiving the input signal, and a second terminal coupled to the second intermediate terminal of the second feedback circuit; and
a third capacitor, having a first terminal for receiving the input signal, and a second terminal coupled to the second intermediate terminal of the second feedback circuit.

16. A resonating device, comprising:
an amplifying circuit, having a first input terminal, and an output terminal for outputting an output signal;

a first feedback circuit, coupled between the first input terminal and the output terminal of the amplifying circuit, wherein the first feedback circuit comprise a T-network;

a second feedback circuit, coupled between the first input terminal and the output terminal of the amplifying circuit, wherein the second feedback circuit comprise a T-network, and the T-network comprising:
- a first capacitor, having a first terminal coupled to the first input terminal of the amplifying circuit, and a second terminal coupled to the second intermediate terminal;
- a second capacitor, having a first terminal coupled to the second intermediate terminal, and a second terminal coupled to the output terminal of the amplifying circuit; and
- a third capacitor, having a first terminal coupled to the second intermediate terminal, and a second terminal coupled to the reference voltage; and
- a resistor, having a first terminal coupled to the second intermediate terminal, and a second terminal coupled to a reference voltage; and a gain adjusting circuit, having an input terminal for receiving an input signal, and a first output terminal coupled to the first input terminal of the amplifying circuit;

wherein a first equivalent impedance on a first intermediate terminal in the first feedback circuit substantially equals a second equivalent impedance on a second intermediate terminal in the second feedback circuit, and the gain adjusting circuit is arranged to tune a transfer function from the input signal to the output signal.

* * * * *